United States Patent
Gerhard et al.

(10) Patent No.: US 11,695,253 B2
(45) Date of Patent: Jul. 4, 2023

(54) SEMICONDUCTOR LASER DIODE

(71) Applicant: OSRAM OLED GmbH, Regensburg (DE)

(72) Inventors: Sven Gerhard, Alteglofsheim (DE); Christoph Eichler, Donaustauf (DE); Alfred Lell, Maxhütte-Haidhof (DE); Bernhard Stojetz, Wiesent (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 17/720,794

(22) Filed: Apr. 14, 2022

(65) Prior Publication Data

US 2022/0239069 A1 Jul. 28, 2022

Related U.S. Application Data

(62) Division of application No. 16/611,372, filed as application No. PCT/EP2018/065185 on Jun. 8, 2018, now Pat. No. 11,336,078.

(30) Foreign Application Priority Data

Jun. 19, 2017 (DE) ...................... 10 2017 113 389.5

(51) Int. Cl.
*H01S 5/22* (2006.01)
*H01S 5/32* (2006.01)
(Continued)

(52) U.S. Cl.
CPC ............ *H01S 5/22* (2013.01); *H01S 5/04253* (2019.08); *H01S 5/04254* (2019.08);
(Continued)

(58) Field of Classification Search
CPC .... H01S 5/22; H01S 5/04253; H01S 5/04254; H01S 5/3211; H01S 5/32341; H01S 2301/16
See application file for complete search history.

(56) References Cited

U.S. PATENT DOCUMENTS 6,327,413 B1 12/2001 Kinoshita
7,203,215 B2 4/2007 Oeda et al.
(Continued)

FOREIGN PATENT DOCUMENTS

CN 105742422 A 7/2016
CN 105811242 A 7/2016
(Continued)

OTHER PUBLICATIONS

Lin Jie, "Development of Organic Laser Device Under Electrical Pumping," China Doctoral Dissertations Full-Test Database, Information Technology Series, No. 6, Jun. 15, 2012, with English Abstract.
(Continued)

*Primary Examiner* — Yuanda Zhang
(74) *Attorney, Agent, or Firm* — DLA Piper LLP (US)

(57) ABSTRACT

A semiconductor laser diode is specified, the semiconductor laser diode includes a semiconductor layer sequence having an active layer having a main extension plane and which, in operation, is configured to generate light in an active region and emit light via a light-outcoupling surface, the active region extending from a back surface opposite the light-outcoupling surface to the light-outcoupling surface along a longitudinal direction in the main extension plane, the semiconductor layer sequence having a surface region on which a first cladding layer is applied in direct contact, the first cladding layer having a transparent material from a material system different from the semiconductor layer
(Continued)

sequence, and the first cladding layer being structured and having a first structure.

11 Claims, 16 Drawing Sheets

(51) Int. Cl.
*H01S 5/042* (2006.01)
*H01S 5/323* (2006.01)
(52) U.S. Cl.
CPC ........ *H01S 5/3211* (2013.01); *H01S 5/32341* (2013.01); *H01S 2301/16* (2013.01)

(56) References Cited

U.S. PATENT DOCUMENTS

| | | | |
|---|---|---|---|
| 10,333,278 | B2 | 6/2019 | Vierheilig et al. |
| 10,811,843 | B2 | 10/2020 | Gerhard et al. |
| 2004/0184497 | A1 | 9/2004 | Kneissl et al. |
| 2007/0165685 | A1 | 7/2007 | Mizuuchi et al. |
| 2008/0008220 | A1 | 1/2008 | Ueda et al. |
| 2008/0273563 | A1 | 11/2008 | Schmidt et al. |
| 2008/0298418 | A1* | 12/2008 | Uchida ............... H01S 5/04253 372/50.124 |
| 2009/0092163 | A1 | 4/2009 | Hirata et al. |
| 2009/0196319 | A1 | 8/2009 | Hori et al. |
| 2010/0208763 | A1 | 8/2010 | Engl et al. |
| 2010/0284434 | A1 | 11/2010 | Koenig et al. |
| 2010/0327300 | A1 | 12/2010 | Epler et al. |
| 2011/0051768 | A1 | 3/2011 | Bour et al. |
| 2011/0260202 | A1 | 10/2011 | Lutgen et al. |
| 2012/0043571 | A1 | 2/2012 | Chu et al. |
| 2013/0228808 | A1* | 9/2013 | Lester ..................... H01L 33/46 257/98 |
| 2015/0194788 | A1 | 7/2015 | Mueller et al. |
| 2016/0190386 | A1 | 6/2016 | Nishioka |
| 2017/0264080 | A1 | 9/2017 | Lell et al. |
| 2020/0091681 | A1 | 3/2020 | Gerhard et al. |

FOREIGN PATENT DOCUMENTS

| | | |
|---|---|---|
| DE | 103 39 985 A1 | 3/2005 |
| DE | 10 2016 125 857 A1 | 7/2018 |
| JP | 11-220212 A | 8/1999 |
| JP | 2004-031823 A | 1/2004 |
| JP | 2012-44171 A | 3/2012 |
| JP | 2016-201474 A | 12/2016 |
| KR | 10-0945993 B1 | 3/2010 |
| WO | 2017/055284 A1 | 4/2017 |
| WO | 2017/055287 A1 | 4/2017 |

OTHER PUBLICATIONS

Xiang Wu, "Beam Properties and Beam Combining Technique for Semiconductor Lasers," China Master's Theses, Full-Text Database, (Ph.D.) Basic Science Series, No. 3, Sep. 15, 2004, with English Abstract.
Yatao Ren et al., "Simultaneous retrieval of temperature-dependent absorption coefficient and conductivity of participating media," *Scientific Reports*, vol. 6, Feb. 25, 2016.
The Decision of Refusal dated Oct. 4, 2021, of counterpart Japanese Application No. 2019-570091, along with an English translation.
The Second Office Action dated Jul. 16, 2021, of counterpart Chinese Application No. 201880040771.X, along with an English summary.
Notification of Reasons for Refusal dated Feb. 1, 2021, of counterpart Japanese Application No. 2019-570091, along with an English translation.
Reconsideration Report drafted Mar. 30, 2022, of counterpart Japanese Patent Application No. 2019-570091, along with an English translation.
Trial and Appeal Decision dated Feb. 1, 2023, of counterpart Japanese Patent Application No. 2019-570091, along with an English translation.

* cited by examiner

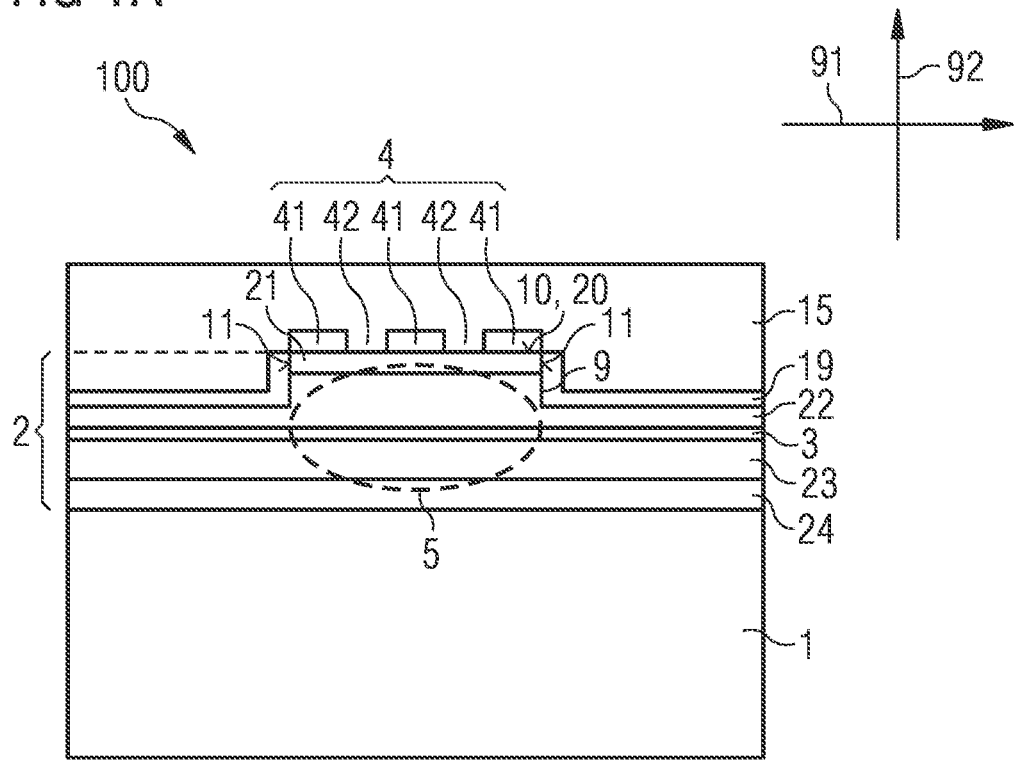
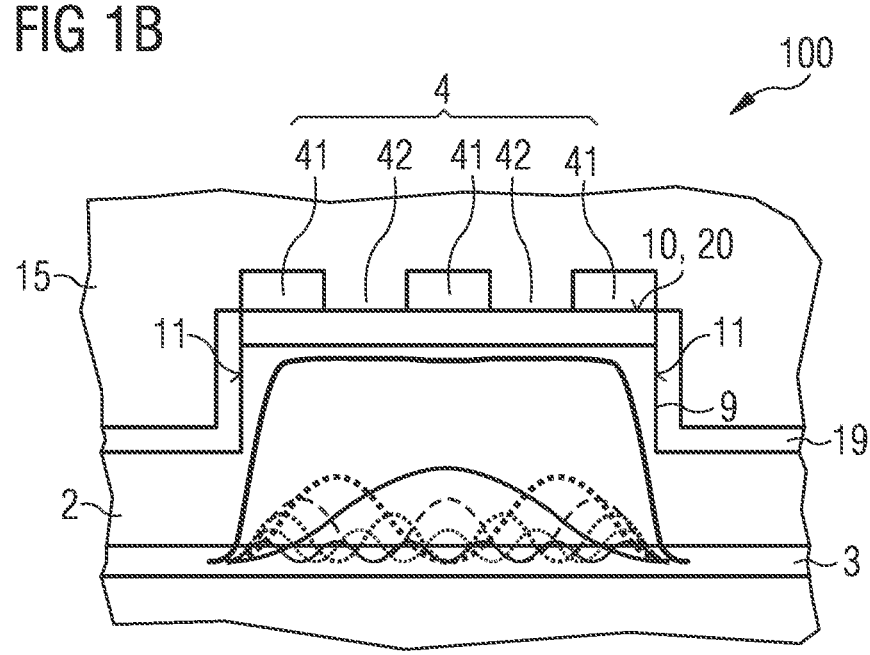

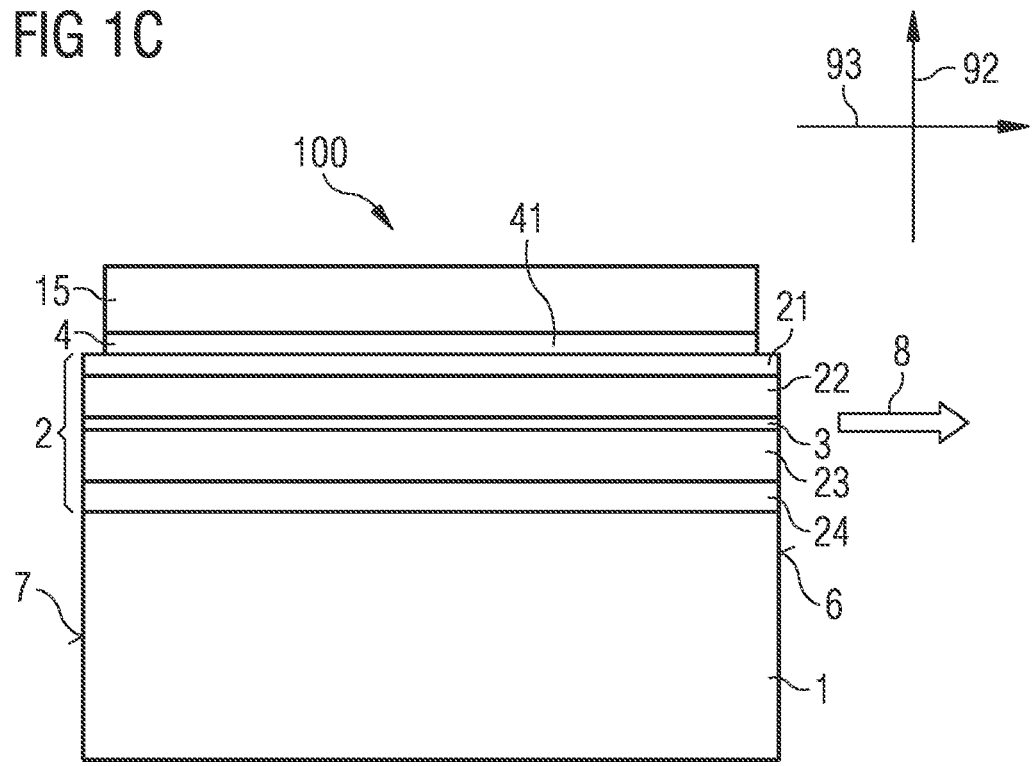
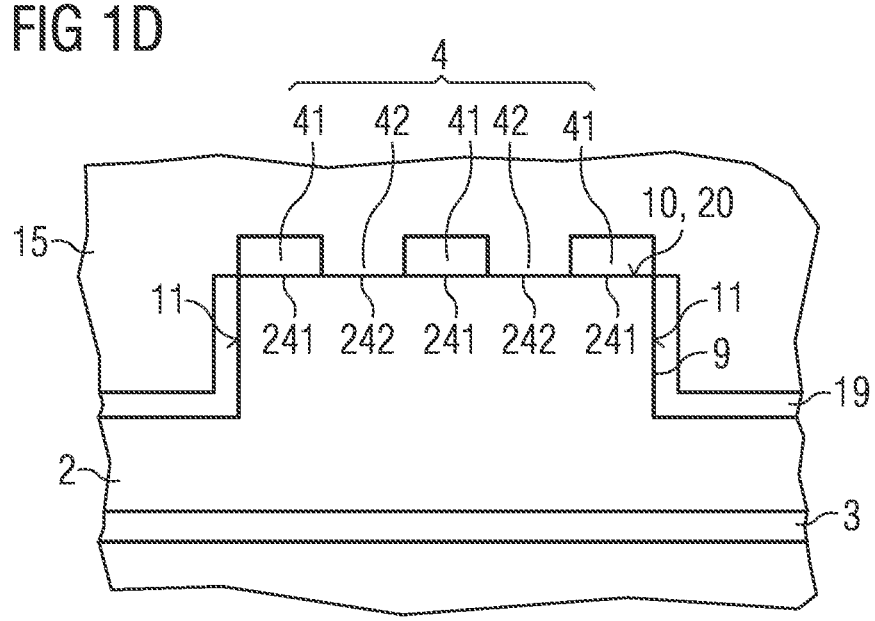

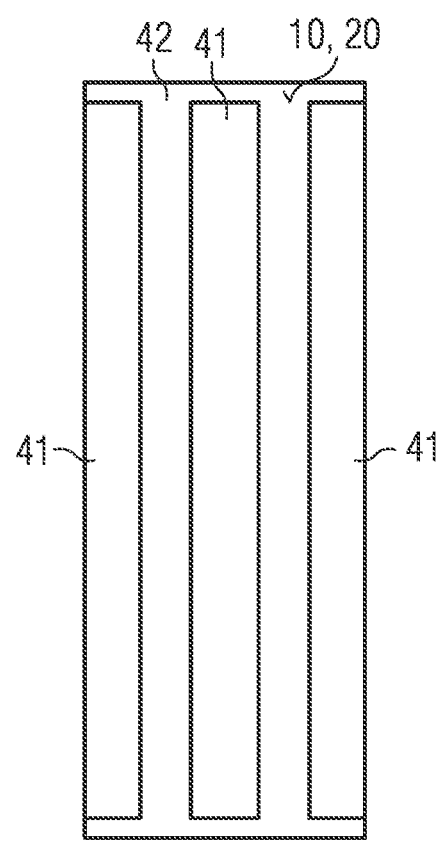

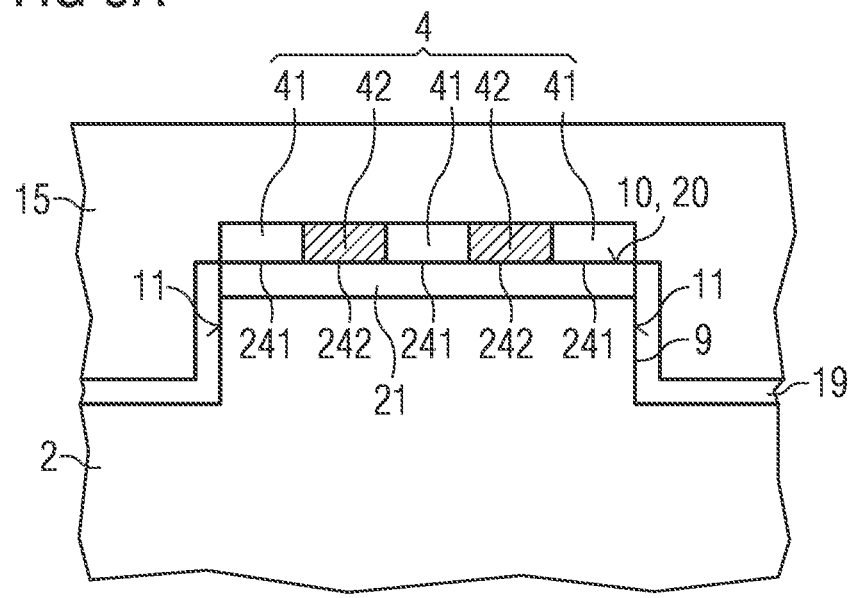
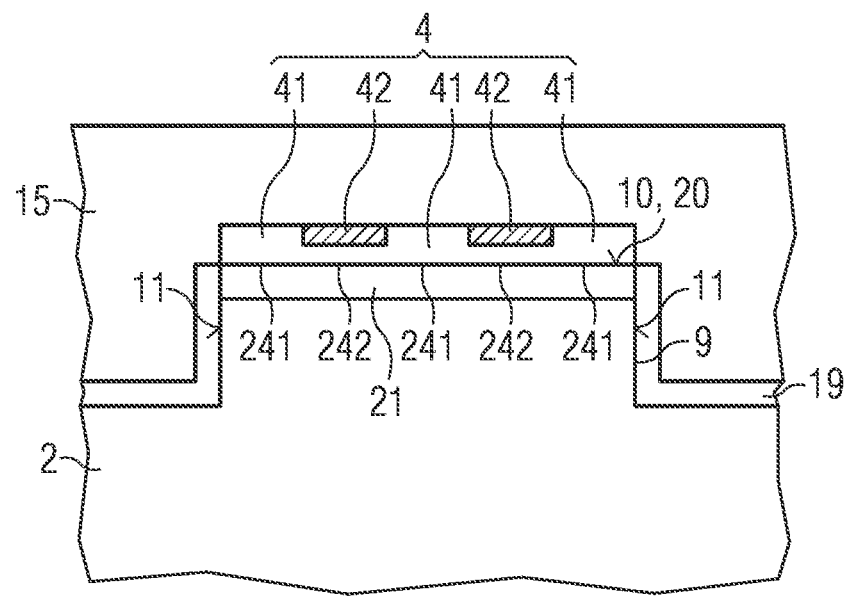

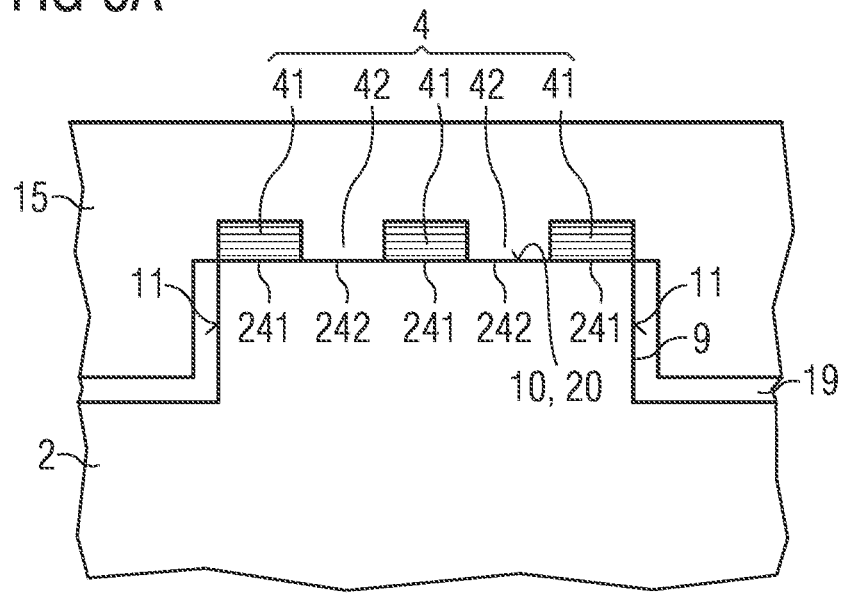
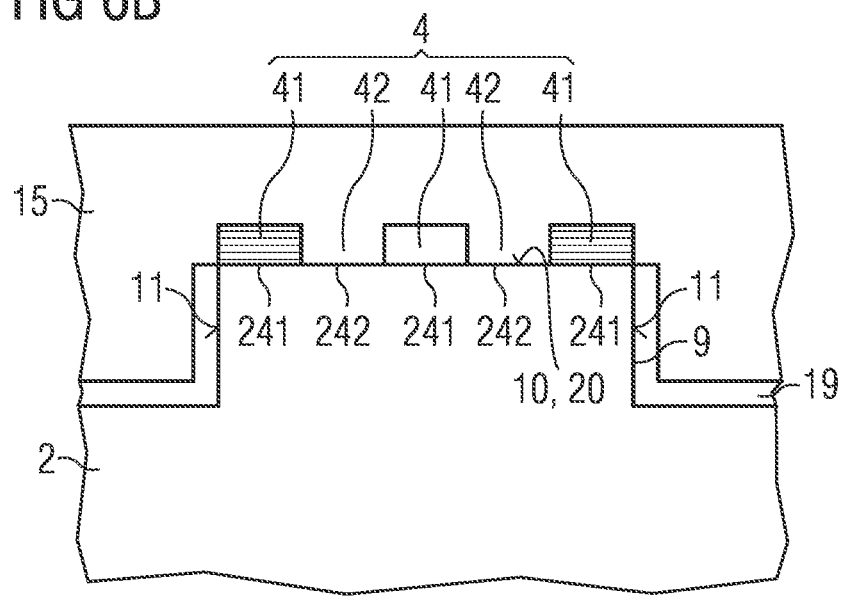

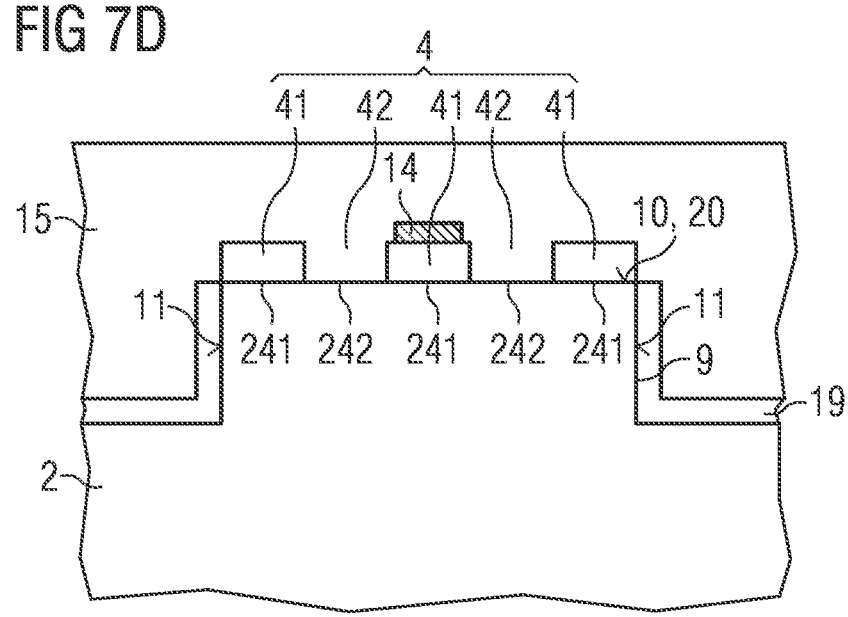
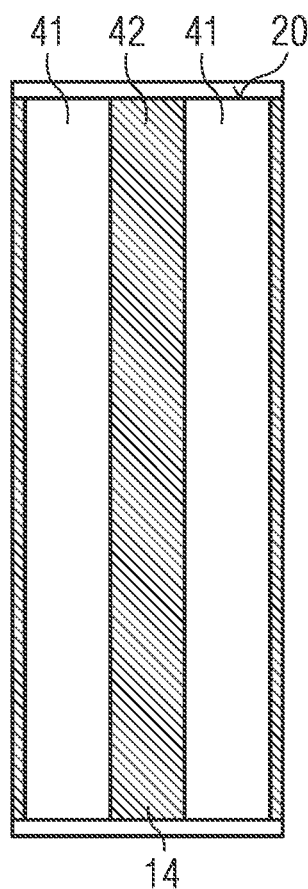 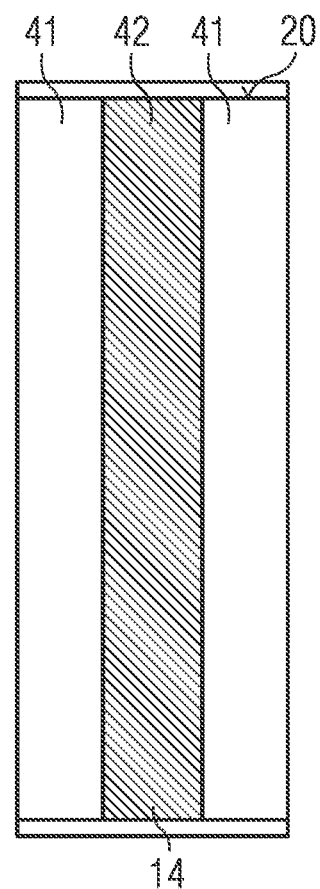

SEMICONDUCTOR LASER DIODE

TECHNICAL FIELD

This disclosure relates to a semiconductor laser diode.

BACKGROUND

In an edge-emitting laser diode, the light-generating layer is arranged between cladding layers which, due to their refractive index, cause wave guidance in the layer stack direction and thus contribute to the formation of laser modes. The cladding layers usually consist of the doped semiconductor material of the diode since a good electrical resistance should be achieved in addition to the mode guidance. However, materials such as AlGaN, which is used for cladding layers of laser diodes based on nitride compound semiconductor materials, are difficult to produce with a high p-doping and thus with a good conductivity so that a compromise must always be found between electrical conductivity and optical absorption.

Furthermore, high-power laser diodes usually guide several longitudinal and lateral laser modes so that the optical intensity on the output facet is caused by the sum of all laser modes oscillating in the laser. However, this can lead to an inhomogeneous intensity distribution, especially in the lateral direction, which can result in intensity increases and thus a facet overload at such locations. This can result in facet damage and destruction of the laser. To avoid this problem, it is known to insulate parts of the contact materials intended for the electrical connection of the semiconductor material from the semiconductor material with an insulating layer and open that insulating layer only in certain regions. In this way, current is injected into the semiconductor material only at the open regions, which can only be distributed via the transverse conductivity of the semiconductor materials. This results in regions far away from the openings being supplied with less current than those directly below the openings. Although this allows the mode dynamics to be controlled, the design freedom of such measures and, at the same time, the size of the effects achieved are clearly limited.

SUMMARY

We provide a semiconductor laser diode including a semiconductor layer sequence having an active layer having a main extension plane and adapted, in operation, to generate light in an active region and emit light via a light-outcoupling surface, wherein the active region extends from a back surface opposite the light-outcoupling surface to the light-outcoupling surface along a longitudinal direction in the main extension plane, the semiconductor layer sequence has a surface region on which a first cladding layer is applied in direct contact, the first cladding layer includes a transparent material from a material system different from the semiconductor layer sequence, and the first cladding layer is structured and has a first structure.

We also provide a method of manufacturing the semiconductor laser diode including a semiconductor layer sequence having an active layer having a main extension plane and adapted, in operation, to generate light in an active region and emit light via a light-outcoupling surface, wherein the active region extends from a back surface opposite the light-outcoupling surface to the light-outcoupling surface along a longitudinal direction in the main extension plane, the semiconductor layer sequence has a surface region on which a first cladding layer is applied in direct contact, the first cladding layer includes a transparent material from a material system different from the semiconductor layer sequence, and the first cladding layer is structured and has a first structure, growing the semiconductor layer sequence by an epitaxial process, and applying the first cladding layer by a non-epitaxial process.

We further provide a semiconductor laser diode including a semiconductor layer sequence having an active layer having a main extension plane and configured, in operation, to generate light in an active region and emit light via a light-outcoupling surface, wherein the active region extends from a back surface opposite the light-outcoupling surface to the light-outcoupling surface along a longitudinal direction in the main extension plane, the semiconductor layer sequence has a surface region on which a first cladding layer is applied in direct contact, the first cladding layer includes a transparent material from a material system different from the semiconductor layer sequence, the first cladding layer is structured and has a first structure, the surface region has at least one first surface partial region and at least one second surface partial region immediately adjacent thereto, the first cladding layer in the second surface partial region has a void formed by an opening or gap, a metallic material is applied in the void, and the metallic material in the void extends to the surface region of the semiconductor layer sequence and is in direct contact with the semiconductor layer sequence.

BRIEF DESCRIPTION OF THE DRAWINGS

FIGS. 1A to 1E show schematic illustrations of a semiconductor laser diode according to an example.

FIGS. 4A to 6B show schematic illustrations of semiconductor laser diodes according to further examples.

Figure 2A:
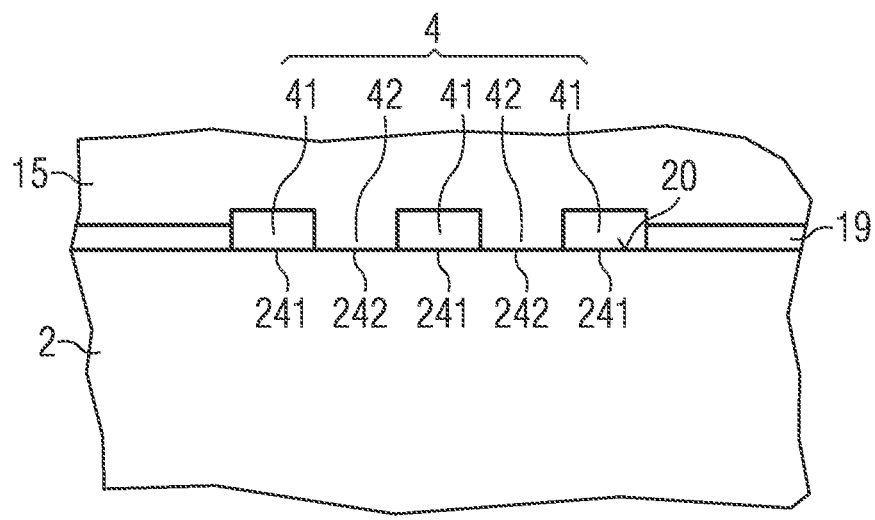
FIGS. 2A and 2B show schematic illustrations of semiconductor laser diodes according to further examples.
Figure 2B:
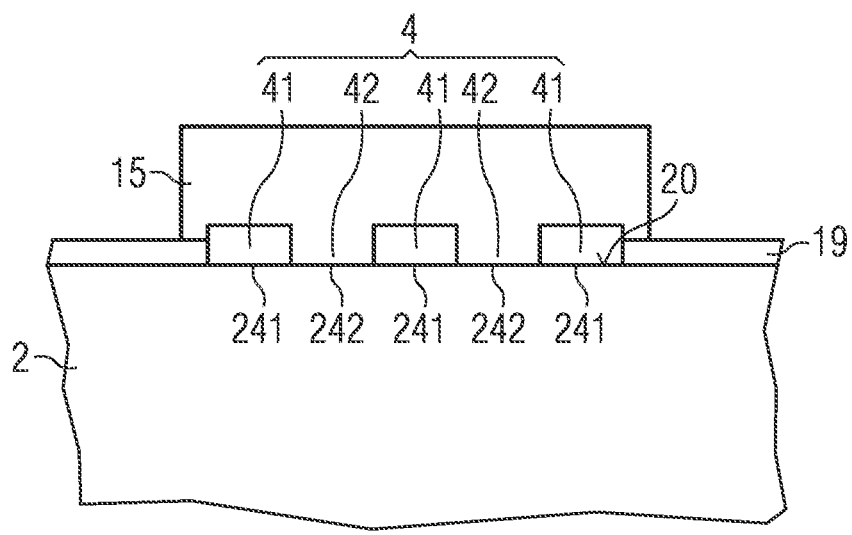

REFERENCE LIST 1 substrate
2 semiconductor layer sequence
3 active layer
4 first cladding layer
5 active region
6 light-outcoupling surface
7 rear surface
8 light
9 ridge waveguide structure
10 ridge top side
11 ridge side surface
14 contact layer
15 bonding layer
19 passivation material
20 surface region
21 semiconductor contact layer
22, 23 waveguide layer
24 second cladding layer
41 first region
42 second region
91 lateral direction
92 vertical direction
93 longitudinal direction
94, 95, 96 distance 97 width
100 semiconductor laser diode
241 first surface partial region
242 second surface partial region

DETAILED DESCRIPTION

Our semiconductor laser diode may have at least one active layer that generates light in an active region during operation of the laser diode. In particular, the active layer can be part of a semiconductor layer sequence comprising a plurality of semiconductor layers and can have a main extension plane perpendicular to an arrangement direction of the layers of the semiconductor layer sequence. The light generated in the active layer and especially in the active region during operation of the semiconductor laser diode can be emitted via a light-outcoupling surface.

For example, the active layer can have exactly one active region. The active region can at least partly be defined by a contact surface of electrically conductive layers with the semiconductor layer sequence, i.e., at least partly by a surface through which current is injected into the semiconductor layer sequence and thus into the active layer. Furthermore, the active region can also be defined at least partially by a ridge waveguide structure, i.e., by a ridge formed in the form of an elongated elevation in the semiconductor material of the semiconductor layer sequence.

In our method of manufacturing a semiconductor laser diode, an active layer is produced that generates light, especially in the infrared to ultraviolet spectrum, during operation of the semiconductor laser diode. In particular, a semiconductor layer sequence can be produced with the active layer. The examples and features described above and in the following apply equally to the semiconductor laser diode and to the method of manufacturing the semiconductor laser diode.

The semiconductor laser diode may have, in addition to the light-outcoupling surface, a rear surface opposite the light-outcoupling surface. The light-outcoupling surface and the rear surface, which can also be referred to as facets, can in particular be side surfaces of the semiconductor laser diode and in particular at least partially of the semiconductor layer sequence. Suitable optical coatings, in particular reflective or partially reflective layers or layer sequences, which can form an optical resonator for the light generated in the active layer, can be applied to the light-outcoupling surface and the rear surface. The active region can extend between the rear surface and the light-outcoupling surface along a direction, which is the longitudinal direction. The longitudinal direction can in particular be parallel to the main extension plane of the active layer. The arrangement direction of the layers on top of each other, i.e., a direction perpendicular to the main extension plane of the active layer is the vertical direction. A direction perpendicular to the longitudinal direction and perpendicular to the vertical direction is the transversal direction or the lateral direction. The longitudinal direction and the transversal/lateral direction can thus span a plane parallel to the main extension plane of the active layer.

The semiconductor layer sequence can in particular be an epitaxial layer sequence, i.e., an epitaxially grown semiconductor layer sequence. In this example, a plurality of semiconductor layers including the active layer can be grown on top of each other, wherein the semiconductor layers are based on a compound semiconductor material system, respectively.

The semiconductor layer sequence can be based on InAlGaN, for example. InAlGaN-based semiconductor layer sequences include in particular those in which the epitaxially produced semiconductor layer sequence generally comprises a layer sequence of different individual layers which contains at least one individual layer which comprises a material from the III-V compound semiconductor material system $In_xAl_yGa_{1-x-y}N$ with $0 \leq x \leq 1$, $0 \leq y \leq 1$ and $x+y \leq 1$. In particular, the active layer can be based on such a material. Semiconductor layer sequences that have at least one active layer based on InAlGaN can, for example, emit electromagnetic radiation in an ultraviolet to green or even yellow wavelength range.

Alternatively or additionally, the semiconductor layer sequence can also be based on InAlGaP, i.e., the semiconductor layer sequence can have different individual layers, of which at least one individual layer, e.g. the active layer, comprises a material made of the III-V compound semiconductor material system $In_xAl_yGa_{1-x-y}P$ with $0 \leq x \leq 1$, $0 \leq y \leq 1$ and $x+y \leq 1$. Semiconductor layer sequences having at least one active layer based on InAlGaP can, for example, preferably emit electromagnetic radiation with one or more spectral components in a green to red wavelength range.

Alternatively or additionally, the semiconductor layer sequence can also comprise other III-V compound semiconductor material systems such as an InAlGaAs-based material, or II-VI compound semiconductor material systems. In particular, an active layer of a light-emitting semiconductor chip comprising an InAlGaAs based material can be capable of emitting electromagnetic radiation having one or more spectral components in a red to infrared wavelength range.

A II-VI compound semiconductor material may have at least one element from the second main group such as Be, Mg, Ca, Sr, and one element from the sixth main group such as O, S, Se. For example, the II-VI compound semiconductor materials include ZnO, ZnMgO, CdS, ZnCdS, MgBeO.

The active layer and, in particular, the semiconductor layer sequence with the active layer can be arranged on a substrate. The substrate may comprise a semiconductor material such as a compound semiconductor material system mentioned above, or another material. In particular, the substrate can comprise or be made of sapphire, GaAs, GaP, GaN, InP, SiC, Si, Ge and/or a ceramic material as for instance SiN or AlN. For example, the substrate can be a growth substrate on which the semiconductor layer sequence is grown. The active layer and, in particular, a semiconductor layer sequence with the active layer can be grown on the growth substrate by an epitaxial process, for example, by metal-organic vapor phase epitaxy (MOVPE) or molecular beam epitaxy (MBE), and furthermore be provided with electrical contacts. Moreover, it may also be possible that the growth substrate is removed after the growth process. In this example, the semiconductor layer sequence can, for example, also be transferred after growth to a substrate that is a carrier substrate.

The active layer can, for example, comprise a conventional pn junction, a double heterostructure, a single quantum well structure (SQW structure) or a multiple quantum well structure (MQW structure) that generates light. The semiconductor layer sequence may include other functional layers and functional regions in addition to the active layer such as p- or n-doped carrier transport layers, i.e., electron or hole transport layers, highly doped p- or n-doped semiconductor contact layers, undoped or p-doped or n-doped confinement, cladding or waveguide layers, barrier layers, planarization layers, buffer layers, protective layers and/or electrodes, and combinations thereof. Moreover, additional layers such as buffer layers, barrier layers and/or protective layers can be arranged also perpendicular to the growth direction of the semiconductor layer sequence, for instance around the semiconductor layer sequence such as for instance on side surfaces of the semiconductor layer sequence.

Furthermore, the semiconductor laser diode has a surface region on which a first cladding layer is directly applied. The surface region of the semiconductor laser diode is in particular a surface region of the semiconductor layer sequence. In other words, the semiconductor layer sequence has a surface with which the semiconductor layer sequence terminates on one side, in particular in the vertical direction. At least part of this surface forms the surface region on which the first cladding layer is applied in direct contact. The first surface region is thus arranged in immediate contact with the surface region of the semiconductor layer sequence and is directly adjoining the semiconductor material of the semiconductor layer sequence without any further intermediate material.

The semiconductor layer sequence may have a ridge waveguide structure. The ridge waveguide structure can, for example, be formed on a side of the semiconductor layer sequence facing away from a substrate. The ridge waveguide structure can have a ridge top side and adjacent ridge side surfaces and can be produced in particular by removing part of the semiconductor material from the side of the semiconductor layer sequence facing away from the substrate. The ridge waveguide structure runs in a longitudinal direction and is delimited on both sides in the lateral direction by the ridge side surfaces and in the vertical direction by the ridge top side on the side facing away from the active layer. The ridge side surfaces as well as the remaining upper side of the semiconductor layer sequence adjacent to the ridge waveguide structure can be covered, for example, by a passivation material. Due to the refractive index jump at the ridge side surfaces of the ridge waveguide structure due to the transition from the semiconductor material to the passivation material, a so-called index guidance of the light generated in the active layer can be effected, which can promote formation of an active region. The surface region of the semiconductor layer sequence directly contacted by the first cladding layer can be formed by a part or preferably by the entire ridge top side. Alternatively, the semiconductor laser diode can also be a so-called broad-area laser diode without a ridge waveguide structure, in which the surface region directly contacted by the first cladding layer can be formed in particular by part of a top side of the semiconductor layer sequence opposite a substrate. The remaining part of the top side can be covered with a passivation material.

The surface region on which the first cladding layer is applied may be formed by a semiconductor contact layer of the semiconductor layer sequence. The semiconductor contact layer can be formed by a highly doped semiconductor layer providing a low electrical contact resistance to an adjacent electrically conductive material. If the first cladding layer is arranged on the p side, the semiconductor contact layer can be a $p^+$-doped semiconductor layer in particular.

The first cladding layer may comprise a transparent material from a material system different from the semiconductor layer sequence. This can mean, in particular, that the first cladding layer has no material from the compound semiconductor material system from which the semiconductor layers of the semiconductor layer sequence are formed. In addition, the first cladding layer can be applied to the surface region using a manufacturing process that is different from the epitaxial process used to produce the semiconductor layer sequence. For example, the manufacturing process for producing the first cladding layer can be a non-epitaxial process. The first cladding layer can be produced, for example, by evaporation, sputtering or chemical vapor deposition.

A layer that can also be a sequence of layers, is denoted as "transparent" which is at least transparent to electromagnetic radiation, for example, with one or more spectral components in the range of infrared, visible and/or ultraviolet light. In combination with the semiconductor laser diode, a transparent layer can be completely or at least partially transparent, especially to such light generated during operation of the semiconductor laser diode. The fact that the first cladding layer has a transparent material means that the light generated in the active region during operation of the semiconductor laser diode reaches into the first cladding layer. In particular, the light generated in the active region can preferably have an intensity profile with a maximum in the vertical direction due to the forming laser mode profile, wherein the intensity at the interface between the semiconductor layer sequence and the first cladding layer can have dropped to a value of greater than or equal to 1% or greater than or equal to 5% or greater than or equal to 10%.

In addition to the first cladding layer, the semiconductor laser diode can have a second cladding layer on one side of the active layer opposite the first cladding layer. The second cladding layer can be formed in particular by part of the semiconductor layer sequence, i.e., one or more semiconductor layers. The first and second cladding layers, which consequently contain materials from different material systems, each have a refractive index that is lower than the refractive index of the active layer. This allows the light generated during operation in the active layer to be guided in the vertical direction. The refractive index of the first and second cladding layers can be the same or different. In addition, the active layer can be arranged between a first and a second waveguide layer, which can be formed by semiconductor layers. In this example, the waveguide layers are arranged together with the active layer between the first and second cladding layers, the first waveguide layer being arranged on a side of the active layer facing the first cladding layer and the second waveguide layer being arranged on a side of the active layer facing away from the first cladding layer. The refractive index of each of the waveguide layers can preferably be smaller than the refractive index of the active layer and larger than the refractive index of the cladding layer arranged on the respective side. The wave guidance can be improved by such a stepped refractive index profile in the vertical direction. Furthermore, between the active layer and the first cladding layer there can be a semiconductor layer in the form of a cladding sublayer, which acts at least partially as a cladding layer, but which alone is not thick enough to ensure sufficient wave guidance without the first cladding layer.

The first cladding layer may comprise an oxide. In particular, the first cladding layer can comprise a transparent conductive oxide. Transparent conductive oxides (TCO) are transparent, electrically conductive materials, usually metal oxides such as zinc oxide, tin oxide, aluminum tin oxide, cadmium oxide, titanium oxide, indium oxide and indium tin oxide (ITO). In addition to binary metal-oxygen compounds such as $ZnO$, $SnO_2$ or $In_2O_3$, ternary metal-oxygen compounds such as $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conducting oxides also belong to the group of TCOs. Furthermore, the TCOs do not necessarily correspond to a stoichiometric composition, and can also be p- or n-doped. Furthermore, the first cladding layer can comprise at least two different TCOs. For example, the different TCOs can be applied to the surface region in an alternating layer stack. In addition, the first cladding layer can comprise laterally and/or longitudinally adjacent regions in which different TCOs are arranged.

The first cladding layer may be structured and have a first structure. This means that the first cladding layer is not formed as a uniform, continuous layer, as it is usually for cladding layers formed by semiconductor layers. Rather, the first cladding layer has laterally and/or longitudinally adjacent regions differing from each other in terms of thickness and/or material. The thickness of the first cladding layer can also have a value of 0 in one or more regions. In other words, the first cladding layer can have a first structure with at least one void free of the material of the first cladding layer. The structural characteristics can be present individually or in a plurality.

For example, the surface region can have at least a first surface partial region and at least an immediately adjacent second surface partial region, and the first cladding layer can have a first thickness in the first surface partial region and a second thickness in the second surface partial region, the first thickness being greater than the second thickness. The first cladding layer can therefore have recessed and/or elevated regions relative to each other, with parameters such as thickness, height and depth of regions of the first cladding layer measured in the vertical direction unless otherwise described. Alternatively or additionally, the first cladding layer can have a first material in the first surface partial region and, additionally or alternatively, a second material in the second surface partial region, wherein the first and second materials, both of which can in particular be TCOs, are different from each other. In this example, the first cladding layer can comprise only a first material on a first surface partial region of the surface region of the semiconductor layer sequence, while the first cladding layer comprises only a second material different from the first material on a second surface partial region adjacent to the first surface partial region. Furthermore, the first cladding layer can comprise only a first material on a first surface partial region, while the first cladding layer can comprise at least one recessed region in a first material on a second surface partial region adjacent to the first surface partial region, in which recessed region a second material is arranged.

Furthermore, the first cladding layer can comprise at least one void arranged, for example, in the second surface partial region and formed by an opening or a gap. In particular, an opening can be formed by a hole in the material of the first cladding layer completely surrounded by the material of the first cladding layer in a plane perpendicular to the vertical direction and reaching completely through the first cladding layer in the vertical direction. For example, a gap can be formed by a trench that completely separates two or more regions formed by material of the first cladding layer in the longitudinal and/or lateral direction. Accordingly, the first cladding layer can comprise a plurality of regions between which there are voids. The regions formed by the material of the first cladding layer, separated by one or more gaps, can be, for example, longitudinally and/or transversely extending stripes and/or island-shaped.

A metallic material may be applied to at least one region of the first cladding layer. The metallic material can in particular be the electrical connection of the surface of the semiconductor layer sequence having the surface region on which the first cladding layer is applied. Accordingly, the electrical connection can be made via the metallic material by the first cladding layer. Furthermore, the cladding layer can have at least one void in which a metallic material is applied. The metallic material can particularly preferably reach to the surface region of the semiconductor layer sequence and be in direct contact with the semiconductor layer sequence. Accordingly, an electrical connection of the surface region can also be made directly in the voids of the first cladding layer. The metallic material can have a different contact resistance to the surface region of the semiconductor layer sequence and/or a different electrical conductivity compared to the material of the first cladding layer so that the current injection into the surface region of the semiconductor layer sequence can be adjusted in the desired manner by selecting the materials and the structure of the first cladding layer and the metallic material. Furthermore, the metallic material can exhibit an absorption for the light generated in the semiconductor layer sequence during operation.

The metallic material may comprise or be formed by a bonding layer. The bonding layer can be applied to the first cladding layer and be intended for the external electrical connection of the semiconductor laser diode. For example, the bonding layer can make it possible to solder the semiconductor laser diode onto a heat sink or other carrier. Alternatively, the bonding layer can be contacted and electrically connected via a bonding wire. In particular, the bonding layer can directly contact at least parts or the entire first cladding layer.

The metallic material may have a metallic contact layer that can be applied to the first cladding layer in addition to the bonding layer. The metallic contact layer can be arranged in particular between the semiconductor layer sequence and the bonding layer. Furthermore, the metallic contact layer can be structured and have a second structure. The second structure can be the same or similar to the first structure of the first cladding layer. For this purpose, the metallic contact layer can be applied congruently with the material of the first contact layer. Furthermore, the first and second structures can be different from each other.

In the semiconductor laser diode, the mode behavior in the active region can be specifically controlled by the described lateral and/or longitudinal structuring of the first cladding layer. In combination with the metallic material applied to it, this effect can be adjusted even better so that the mode behavior can be controlled laterally and longitudinally in a targeted manner and within a very wide range. In semiconductor laser diodes with or without a ridge waveguide structure, this can be controlled in particular such that individual laser modes can be specifically selected and amplified or even suppressed. Instead of the usual measures like a partial covering of the semiconductor surface with dielectric layers, this is possible with the semiconductor laser diode described here by specifically adjusted regions with different absorption and conductivity. As a result, the achievable effects are greater and more precisely controllable. In addition, there is greater design freedom and higher process stability due to the better controllability of the absorption on the basis of direct structuring.

Further advantages and developments are revealed by the examples described below in connection with the figures.

In the examples and figures, identical, similar or identically acting elements are provided with the same reference numerals. The elements illustrated and their size ratios to one another should not be regarded as being to scale, but rather individual elements such as, for example, layers, components, devices and regions, may have been made exaggeratedly large to illustrate them better and/or to aid comprehension.

FIGS. 1A to 1E show an example of a semiconductor laser diode 100, wherein FIG. 1A shows a sectional view with a section plane parallel to a lateral direction 91 and to a vertical direction 92, and FIG. 1C shows a sectional view with a section plane parallel to the vertical direction 92 and to a longitudinal direction 93. FIGS. 1B and 1D each show a part of the view of FIG. 1A, while FIG. 1E shows a view onto the ridge top side 10 of the semiconductor laser diode 100, in which the bonding layer 15 is not shown. The following description refers equally to FIGS. 1A to 1E.

The semiconductor laser diode 100 has a substrate 1 which is, for example, a growth substrate for a semiconductor layer sequence 2 epitaxially grown on it. Alternatively, substrate 1 can also be a carrier substrate to which a semiconductor layer sequence 2 grown on a growth substrate is transferred after growth. For example, the substrate 1 can comprise GaN or be made of GaN on which a semiconductor layer sequence 2 based on an InAlGaN compound semiconductor material has been grown. This means that the semiconductor layers of the semiconductor layer sequence 2 described below each have a semiconductor material from the InAlGaN compound semiconductor material system. In addition, other materials, in particular as described in the general part, are also possible for substrate 1 and semiconductor layer sequence 2. Furthermore, it is also possible that the semiconductor laser diode 100 is free of a substrate. In this example, the semiconductor layer sequence 2 can have been grown on a growth substrate which is subsequently removed. Furthermore, the semiconductor layer sequence 2 can be bonded to an auxiliary substrate after the growth substrate has been removed. This can preferably be done in p-down technology, preferably on a highly thermally conductive substrate. Possible substrate materials include silicon carbide, aluminum nitride, silicon, germanium, sapphire, diamond, diamond-like carbon (DLC) and Cu composite materials.

The semiconductor layer sequence 2 comprises an active layer 3 which is part of the semiconductor layer sequence 2 and is suitable, during operation, for generating light 8, especially laser light when the laser threshold is exceeded, and emitting it via a light out-coupling surface 6. As indicated in FIGS. 1A and 1C, the transversal or lateral direction 91 is defined here and in the following as a direction parallel to a main direction of extension of the layers of the semiconductor layer sequence 2 in a sectional view with a sectional plane parallel to the light-outcoupling surface 6. The arrangement direction of the layers of the semiconductor layer sequence 2 on top of each other and of the semiconductor layer sequence 2 on the substrate 1 is here and in the following referred to as the vertical direction 92. The direction perpendicular to the lateral direction 91 and the vertical direction 92 corresponding to the direction in which the light 8 is emitted, is referred to here and in the following as the longitudinal direction 93.

On a side of the semiconductor layer sequence 2 facing away from the substrate 1, a first cladding layer 4 is applied to a surface region 20. A metallic material in the form of a bonding layer 15, which is provided for the electrical contacting of the semiconductor layer sequence 2 and in particular for current injection from the side of the semiconductor layer sequence 2 remote from the substrate 1, is applied above this. The bonding layer 15, for example, can have one or more materials in the form of an alloy or a layer stack, which can be selected from Au, Pt, Ti, Cr, Al. For example, the bonding layer 15 can be formed by a Ti/Pt/Au layer stack. The semiconductor laser diode 100 can have an additional electrode layer for electrical contacting of the other side of the semiconductor layer sequence 2, which is not shown for reasons of clarity.

The semiconductor layer sequence 2 can have further semiconductor layers in addition to the active layer 3. As mere examples a highly doped semiconductor contact layer 21, including a first and a second waveguide layer 22, 23, between which the active layer is arranged, and a second cladding layer 24 on the side of the active layer 3 facing away from the first cladding layer 4 are shown. Semiconductor contact layer 21 is used to establish a good electrical contact, in particular with bonding layer 15. In addition, other semiconductor layers such as cladding layers, waveguide layers, barrier layers, current spreading layers and/or current-limiting layers can be present alternatively or additionally, which are not shown to simplify the illustration. For example, above the first waveguide layer 22, i.e., between the semiconductor contact layer 21 and the first waveguide layer 22, a cladding sublayer can be arranged, i.e., a semiconductor layer which is formed as a cladding layer with regard to the refractive index, but which is too thin to act alone as a cladding layer in the region of the semiconductor layer sequence 2 above the active layer 3. In this example, the cladding sublayer and the first cladding layer 4 act together as a cladding layer in the region of the semiconductor layer sequence 2 above the active layer 3. Furthermore, it can also be possible that the semiconductor layer sequence 2 does not have a semiconductor contact layer 21 so that the first waveguide layer 22 or, if applicable, a cladding sublayer directly adjoins the first cladding layer 4.

The top side of the semiconductor layer sequence 2 facing away from the substrate 1 is covered with a passivation material 19 except for the surface region 20 in which the first cladding layer 4 contacts the semiconductor layer sequence 2. This passivation material 19 can comprise or be an electrically insulating oxide, nitride or oxynitride such as silicon dioxide, silicon nitride, silicon oxynitride, aluminum oxide, tantalum oxide, rhodium oxide, niobium oxide and/or titanium dioxide. Other oxides, nitrides and oxynitrides with one or more materials selected from Al, Ce, Ga, Hf, In, Mg, Nb, Rh, Sb, Si, Sn, Ta, Ti, Zn and Zr are also possible.

In addition, reflective or partially reflective layers or layer sequences which are also not shown for the sake of clarity and which are provided and arranged for the formation of an optical resonator running in the longitudinal direction 93 in the semiconductor layer sequence 2 can be applied to the light out-coupling surface 6 and the opposite rear surface 7, which form side surfaces of the semiconductor layer sequence 2 and of the substrate 1.

In the example shown, a ridge waveguide structure 9 is formed in the top side of the semiconductor layer sequence 2 facing away from the substrate 1 by removing part of the semiconductor material from the side of the semiconductor layer sequence 2 facing away from the substrate 1. The ridge waveguide structure 9 runs in the longitudinal direction 93 and has a ridge top side 10 on the side facing away from the substrate 1, which forms the surface region 20 on which the first cladding layer 4 is applied in direct contact. Furthermore, the ridge waveguide structure 9 is delimited in the lateral direction 91 on both sides by ridge side surfaces 11. The ridge side surfaces 11, like the adjacent top side regions, are also covered by the passivation material 19. Due to the refractive index jump at the ridge side surfaces 11 due to the transition from the semiconductor material to the passivation material 19, a so-called index guidance of the light generated in the active layer 3 can be effected, which together with the current injection can contribute to the formation of an active region 5 which indicates the region in the semiconductor layer sequence 2 in which the generated light is guided and amplified in laser operation. As shown in FIG. 1A, the ridge waveguide structure 9 can be formed by completely removing the semiconductor material laterally on both sides of the ridge. Alternatively, a so-called "tripod" can also be formed, in which the semiconductor material is removed laterally to the ridge only along two grooves. In particular, these grooves can extend from the light-outcoupling surface 6 to the rear surface 7. Furthermore, a structure known under the term "buried heterostructure" is also possible.

The bonding layer 15 provided on the top side of the semiconductor laser diode 100 for external electrical connection is applied over a large region in the example shown. For example, the bonding layer 15 can solder the semiconductor laser diode 100 onto a heat sink or other external carrier. The passivation material 19 ensures that only the intended surface region 20 is electrically contacted by the bonding layer 15. The side of the semiconductor layer sequence 2 facing the first cladding layer 4 can in particular be p-doped so that a so-called p-down assembly of the semiconductor laser diode 100 can be achieved by such soldering using the bonding layer 15.

The first cladding layer 4 is applied in direct contact on the surface region 20 and structured in the form of a first structure. For this purpose, the first cladding layer 4 comprises first regions 41 and second regions 42, which differ from each other. The first regions 41 are located on first surface partial regions 241 of surface region 20, while the second regions 42 are located on second surface partial regions 242 of surface region 20. As can be seen from FIGS. 1A and 1E, the first regions 41 of the first cladding layer 4 in the example shown are in the form of longitudinal stripes separated by the second regions 42 which are formed as voids in the form of trenches. Alternatively, the voids can also be openings, for example, completely surrounded in a plane parallel to the lateral direction 91 and to the longitudinal direction 93 by the material of the first cladding layer 4 and thus by first regions 41.

The first cladding layer 4 and especially the first regions 41 comprise a transparent material from a material system different from the semiconductor layer sequence 2. In the example described above, where the semiconductor layer sequence is based on an InAlGaN material, the first cladding layer 4 is thus free of a material from the InAlGaN material system. In particular, the first cladding layer can generally be free of material from the III-V and II-VI compound semiconductor material systems. To act as an effective cladding layer, the transparent material of the first cladding layer 4 has a refractive index lower than the refractive index of the active layer 3. If the first waveguide layer 22 is arranged between the active layer and the first cladding layer 4, as in the example shown, the first waveguide layer 22 preferably has a refractive index which lies between the refractive index of the active layer 3 and the first cladding layer 4. As described above, the semiconductor layer sequence 2 can additionally have a cladding sublayer over the first waveguide layer 22 so that in this example the wave guidance is partly due to the cladding sublayer and partly due to the first cladding layer 4. Furthermore, the material of the first cladding layer 4 is electrically conductive so that the surface region 20 in the first surface partial regions 241 is electrically contacted via the regions 41 of the first cladding layer 4. In particular, the cladding layer 4 comprises a TCO, preferably ITO, for example. ITO is generally a mixed oxide containing greater than or equal to 50% and less than or equal to 99% indium (III) oxide ($In_2O_3$) and containing greater than or equal to 1% and less than or equal to 50% tin (IV) oxide ($SnO_2$). Preferably the proportion of $In_2O_3$ is more than 80% and especially preferred more than 90% and the proportion of $SnO_2$ less than 20% and especially preferred less than 10%. The $SnO_2$ component generates impurities in the $In_2O_3$ crystal lattice, which primarily causes the electrical conductivity of the ITO layer. As an alternative to ITO, pure tin oxide, pure indium oxide, zinc oxide, magnesium oxide or any other material mentioned above in the general part are also possible.

In the second regions 42, the metallic material formed by the bonding layer 15 projects through the first cladding layer 4 to the surface region 20 of the semiconductor layer sequence 20 so that the surface region 20 in the second surface partial regions 242 is directly electrically contacted by the bonding layer 15.

The thickness of the semiconductor layers above the active layer 3 as well as the thickness of the first cladding layer 4, which can be several 10 nm, for example, such that part of the light 8 generated during operation in the active layer 3 extends into the first cladding layer 4. In particular, the light 8 generated in the active layer 3 can have an intensity profile in the vertical direction with a maximum, wherein the intensity at the interface between the semiconductor layer sequence 2 and the first cladding layer 4, in particular first regions 41 of the first cladding layer 4, can have dropped to a value greater than or equal to 1% or greater than or equal to 5% or greater than or equal to 10%.

Due to the described structure of the first cladding layer 4, the first cladding layer comprises first regions 41 and second regions 42 that differ in their optical and electrical properties. While the material of the first cladding layer 4 is transparent in the first regions 41 and thus permits penetration of the laser modes, the second regions 42 of the first cladding layer 4 are light-absorbing because they are filled with the metallic material of the bonding layer 15 in the example described. This can influence the lateral laser modes. Furthermore, the bonding layer 15 can, for example, be adjacent to the semiconductor layer sequence 2 with a Ti layer in the second surface partial region 242. Since Ti has a higher contact resistance than ITO to the semiconductor contact layer 21 based on InAlGaN as described above and can be made of p+-GaN, for example, the local current injection into the surface region 20 can be controlled. In addition, the different materials of the first cladding layer 4 and the bonding layer 15 adjacent to the surface region 20 have an effect on the local heat dissipation of the semiconductor layer sequence 2. These effects provide an additional control option for the mode behavior of the light generated in the active layer 3. A typical lateral mode profile is schematically indicated as an example in FIG. 1B. Due to the effects described, which are caused in particular by the first cladding layer 4 and also by the ridge waveguide structure 9, the active region 5 indicated in FIG. 1A is formed in the active layer 3, in which the laser light generation then takes place during operation of the semiconductor laser diode 100. As can be seen from the lateral laser mode profile indicated in FIG. 1B, the mode behavior can be controlled such that no so-called "hot spots" occur so that reliability and efficiency can be improved.

Compared to the example shown in FIGS. 1A to 1E, FIGS. 2A and 2B show parts of further examples in which the semiconductor laser diode 100 is a broad-area laser diode without a ridge waveguide structure. The surface region 20 on which the structured first cladding layer 4 is applied is defined by that part of the top side of the semiconductor layer sequence 2 which is not covered by the passivation material 19. The previous description also applies to these examples.

In the following figures, modifications and developments of the semiconductor laser diode 100 are shown on the basis of parts and views corresponding to the views of FIGS. 1B and 1D or FIG. 1E, respectively. Even though the further figures show semiconductor laser diodes with a ridge waveguide structure 9, the features described also apply to semiconductor laser diodes without a ridge waveguide structure.

FIGS. 3A to 3H show examples of various first structures of the first cladding layer 4 on the surface region 20 using a schematic representation of the first and second regions 41, 42. The examples shown are not to be understood as an exhaustive list, but merely show a few preferred variants. As an alternative to the shown distributions of the first and second ranges 41, 42 these can also be combined with each other or the arrangement of the first and second ranges 41, 42 can also be reversed. Furthermore, the structures of the first cladding layer 4 described in connection with FIGS. 3A to 3H also apply to the other examples.

Figure 3A:
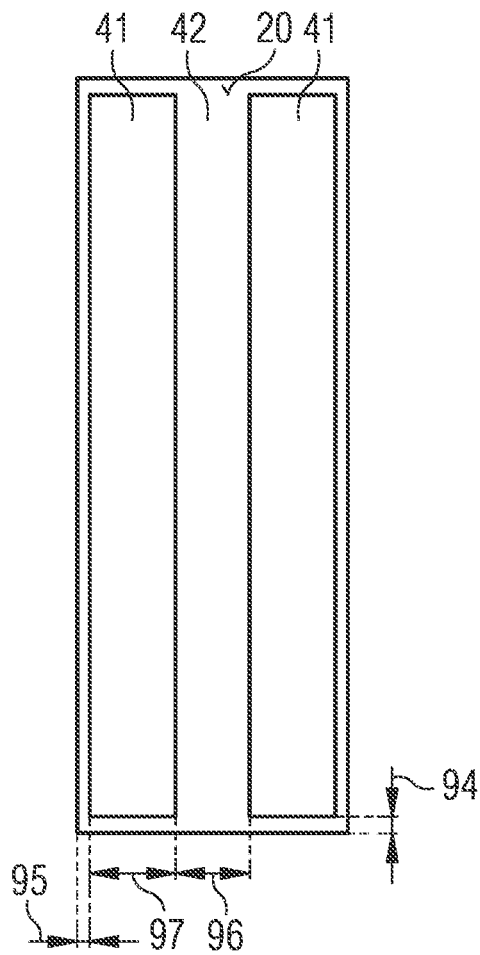
FIGS. 3A to 3H show schematic illustrations of semiconductor laser diodes according to further examples.
Figure 3B:
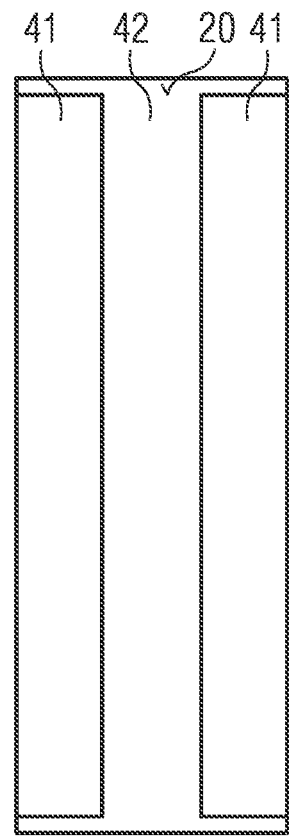
Figure 3C:
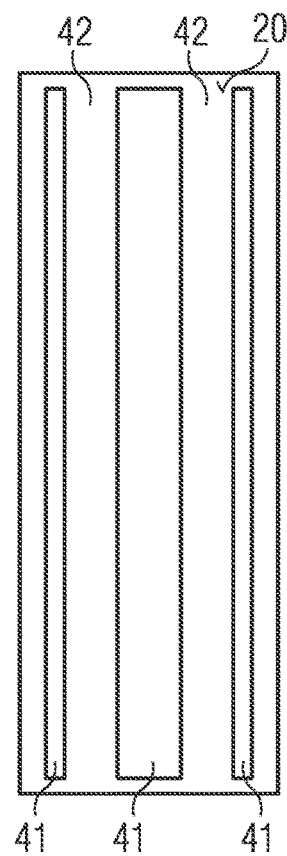

In FIGS. 3A, 3B and 3C, as in the example of FIGS. 1A to 1E, first regions 41 are shown, which are formed ridge-shaped as strips extending in a longitudinal direction, separated from each other by second regions 42 formed as trenches. The first regions can reach up to the edges of the surface region 20 or be distant from them. Furthermore, the first regions 41 can have equal or different widths in the lateral direction.

FIG. 3A furthermore shows distances 94, 95 and 96 of the first regions 41 to the edges of the surface region 20 and to each other as well as the strip width 97 in lateral direction. The values given below also apply to the first structures of the first cladding layer 4 shown in the other figures. Advantageous values for the distance 94 of the first regions 41 to the facets are greater than or equal to 2 µm or greater than or equal to 5 µm or particularly preferably greater than or equal to 10 µm and less than or equal to 200 µm or particularly preferably less than or equal to 50 µm, advantageous values for the distance 95 to the sides of the surface region 20, in a ridge waveguide structure thus to the ridge side surfaces, are greater than or equal to 0 µm and less than or equal to 100 µm or less than or equal to 5 µm or particularly preferably less than or equal to 3 µm. Advantageous values for the lateral distance 96 of immediately adjacent first regions 41 are greater than or equal to 1 µm and less than or equal to 30 µm. Advantageous values for the lateral width 97 are greater than or equal to 5 µm and less than or equal to 30 µm. Typical dimensions of the surface region 20, in a ridge waveguide structure, i.e., the top side of the ridge, can be for the length in the longitudinal direction a range greater than or equal to 200 µm or preferably greater than or equal to 400 µm or particularly preferably greater than or equal to 600 µm and less than or equal to 5 mm or preferably less than or equal to 3 mm or particularly preferably less than or equal to 2 mm, further for the width in the lateral direction a range greater than or equal to 1 µm and less than or equal to 300 µm.

Figure 3D:
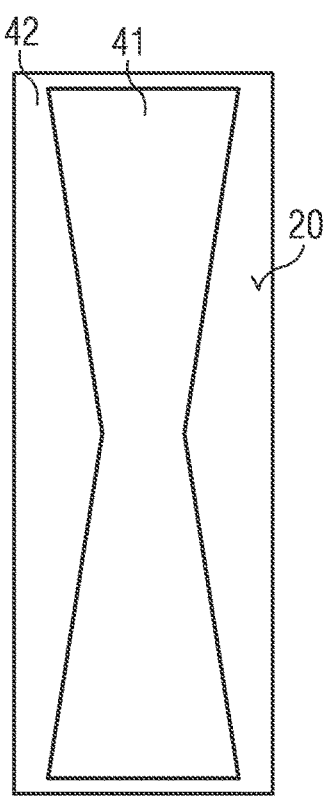
Figure 3E:
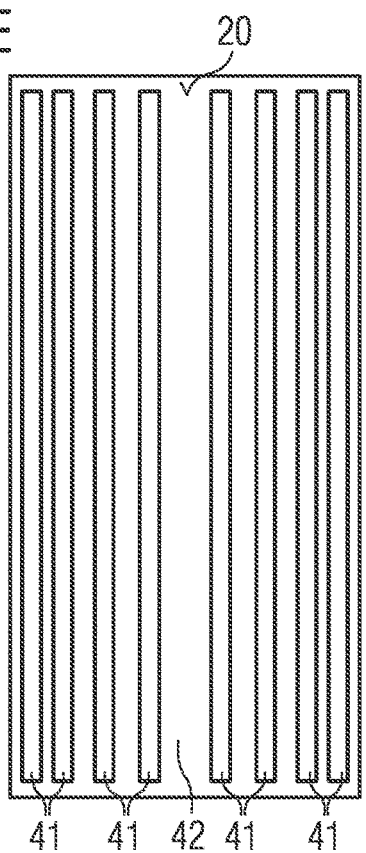
Figure 3F:
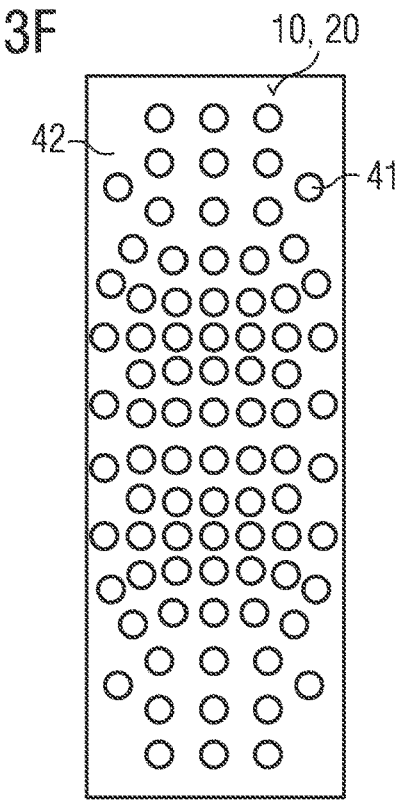

FIG. 3D shows an arrangement in which the lateral width of the first region varies, i.e., decreases from the facets in the longitudinal direction towards the center. This allows the mode distribution close to the facets and in the center of the resonator to be adjusted independently. Alternatively, for example, a broadening of the first region 41 from the facets to the center is also possible.

Figure 3G:
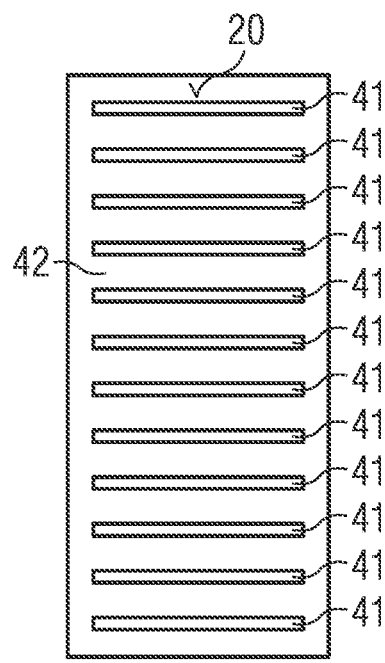
Figure 3H:
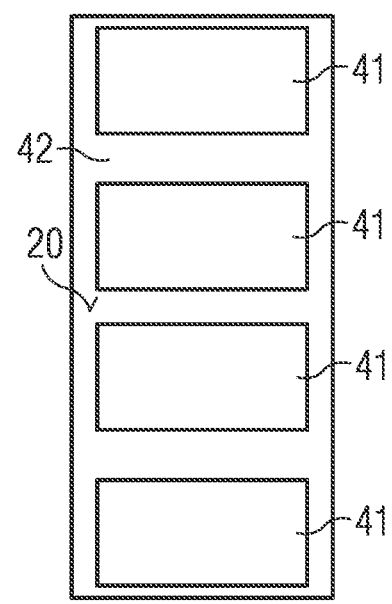

As an alternative to the variants shown in FIGS. 1A to 3D with one, two or three first regions 41, more first regions 41 can be present, for example, in the form of longitudinally extending stripes (FIG. 3E), in the form of islands (FIG. 3F) or in the form of narrow or wide laterally extending stripes (FIGS. 3G and 3H).

Figure 4A:
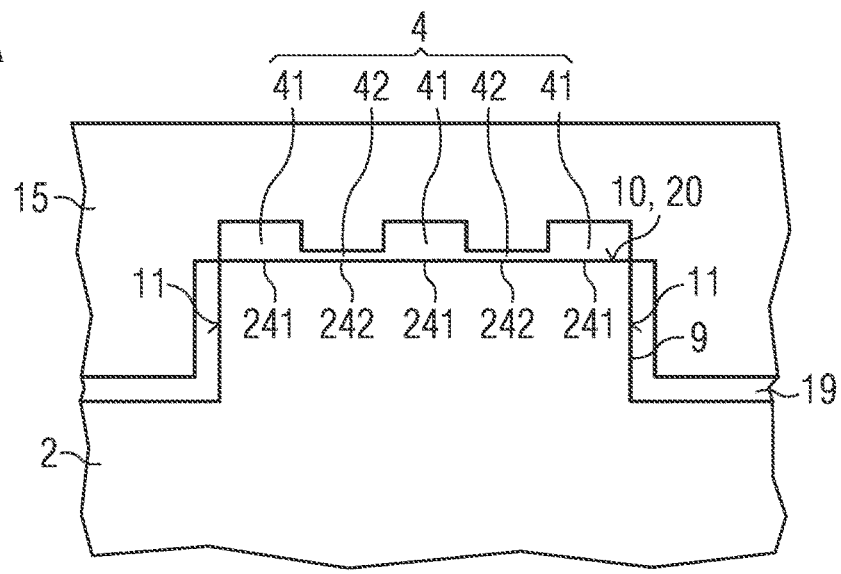
Figure 4B:
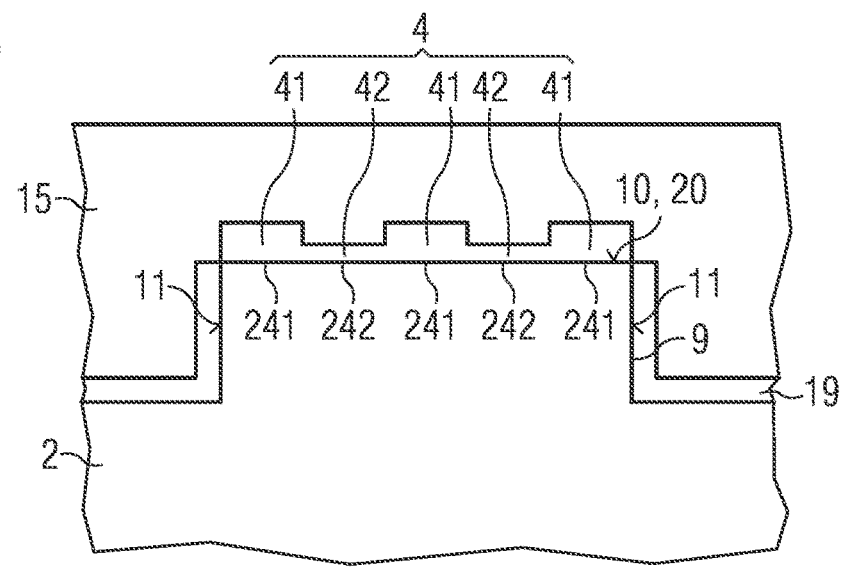
Figure 4C:
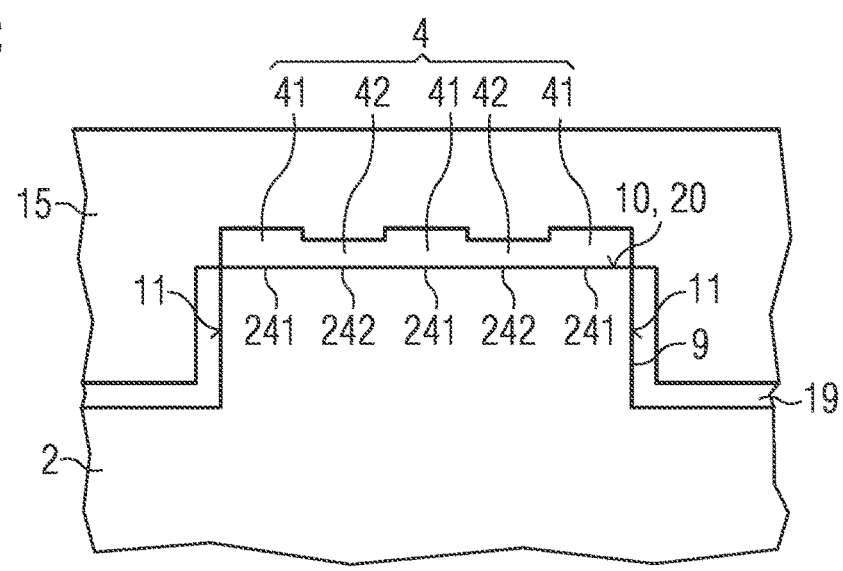

Instead of the second regions 42 shown above that are formed as voids in the first cladding layer 4, the first cladding layer 4 can also have at least first and second regions 41, 42 each containing a material and having different thicknesses in the vertical direction so that the first cladding layer 4 can have first and second regions 41 42 formed as elevations and depressions. FIGS. 4A to 4C show examples corresponding to the example of FIGS. 1A to 1E, where the second regions 42 comprise the material of the first cladding layer 4 with a smaller thickness than the first regions 41. By overmolding the first cladding layer 4 with a metallic material such as the bonding layer 15, the local strength of the absorption of the light generated in the active layer 3 can be adjusted in the first and second regions 41, 42, and thus also the coupling of the laser modes to the corresponding absorption structures. In structures according to FIGS. 3G and 3H with a longitudinally varying structure, for example, the coupling factor for a DFB laser (DFB: distributed feedback) can also be set.

FIGS. 5A and 5B show examples of semiconductor laser diodes 100 where the first cladding layer has 4 first and second regions 41, 42 that differ in the material forming the regions 41, 42. For example, a first material can be applied in a first surface partial region 241 and a second material in a second surface partial region 242 that differ from each other. As shown in FIG. 5A, the second regions 42, which in previous examples were formed as voids, can be filled with another material. Likewise, as shown in FIG. 5B, regions formed as recesses can be filled with a further material. In particular, the different materials can be different TCOs or differently doped TCOs. In other words, the regions of the first cladding layer 4 left free or deepened in the previous examples can be filled with a TCO of different composition or doping, for example. This modulates both the electrical and the optical properties of the first cladding layer 4 over the surface region 20. Depending on the arrangement of regions 41, 42, the resulting different absorption coefficients lead to a different attenuation depending on the arrangement of regions 41, 42 for lateral and/or longitudinal modes of different order. By filling with a TCO instead of a metallic material it can be possible to control the local absorption more accurately. Furthermore, a modulation of the current injection can be achieved via different contact resistances of the different regions 41, 42.

As shown in FIGS. 6A and 6B, one, several or all of the first regions 41, as well as alternatively or additionally of the second regions 42, can comprise different materials in the form of different TCOs, for example, with $In_2O_3$ and $SnO_2$ layers, in an alternating layer stack. As shown in FIG. 6A, for example, all first regions 41 can be formed by such layer stacks. As shown in FIG. 6B, only a few first regions 41 can be formed by such layer stacks, while one or more other first regions 41 can be formed by only one TCO.

Figure 7A:
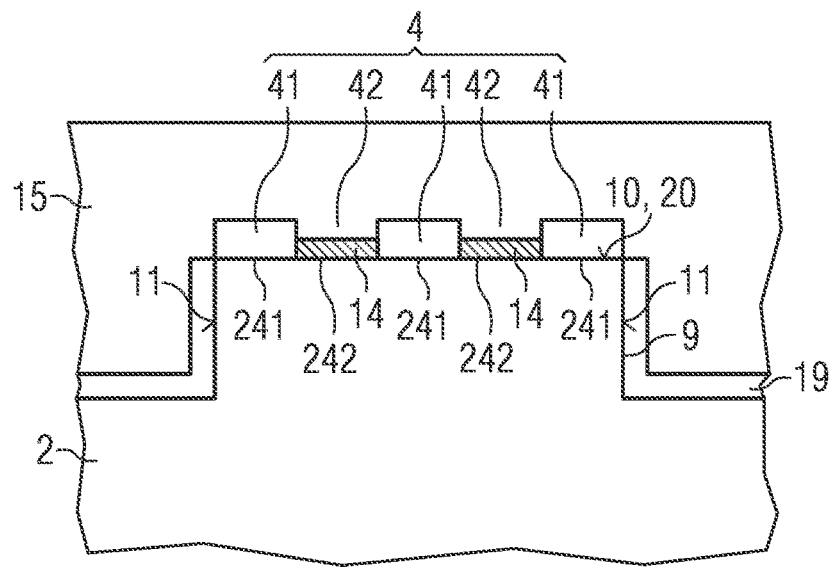
FIGS. 7A to 9E show schematic illustrations of layers of outcoupling mirrors according to further examples.

FIGS. 7A to 9E show further examples of semiconductor laser diodes 100 in which the metallic material deposited on the first cladding layer 4 and/or in regions thereof formed by voids has a metallic contact layer 14 deposited in addition to the bonding layer 15. As shown in FIG. 7A, for example, in the second regions 42 of the first cladding layer 4 formed by voids, a metallic contact layer 14 can be applied directly to the surface partial regions 242. Compared to the material of the first cladding layer 4, this metallic contact layer 14 has, for example, a lower or equal electrical contact resistance so that good current injection can be achieved in combination with high optical absorption in these regions. For example, the electrical contact layer 14 can comprise or be made of one or more materials selected from Pd, Pt and Rh for this purpose. Furthermore, the electrical contact layer 14 can comprise or be made of a material which has a higher electrical contact resistance than the material of the first cladding layer 4 so that a poor current injection can be achieved in combination with a high optical absorption in these regions. For example, the electrical contact layer 14 can comprise or be made of one or more materials selected from Ni, Ti, TiWN, Ag. A similar effect can also be achieved, for example, in a modification corresponding to the example of FIGS. 5A and 5B with ITO in the first regions 41 and ZnO in the second regions 42.

Figure 7B:
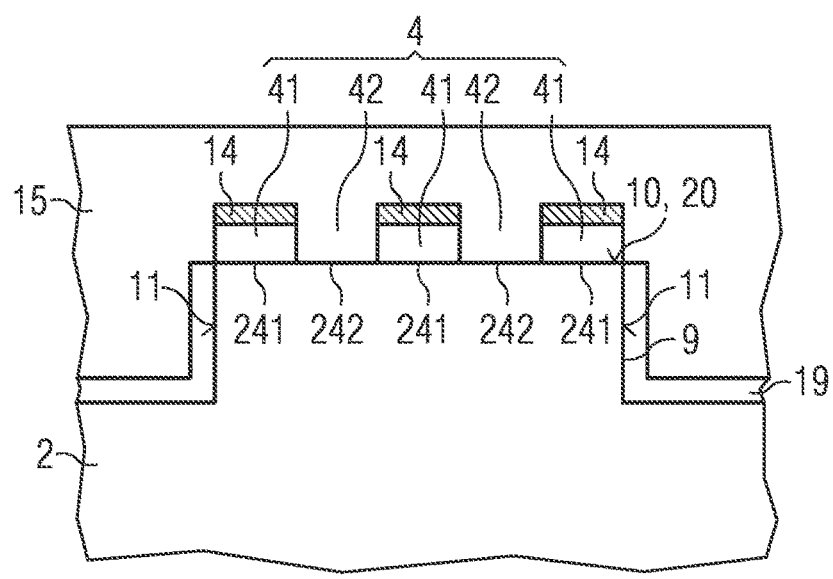
Figure 7C:
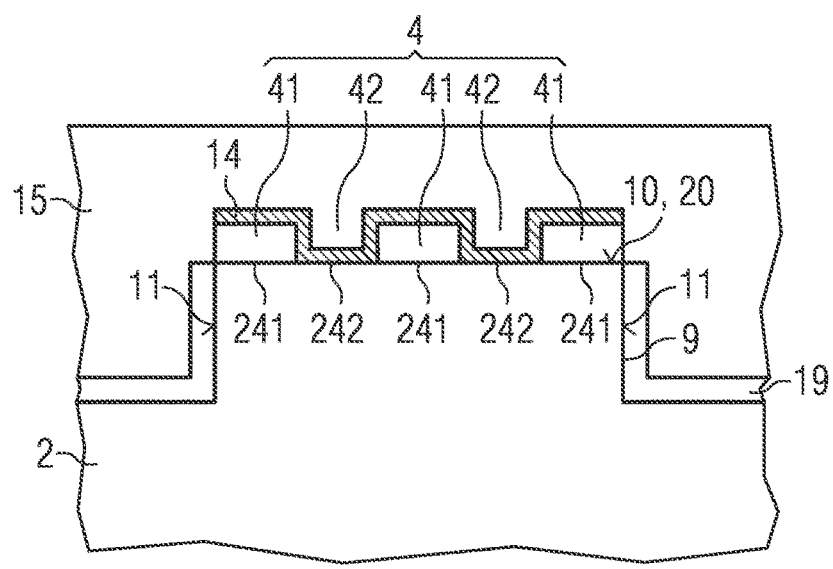
Figure 8C:
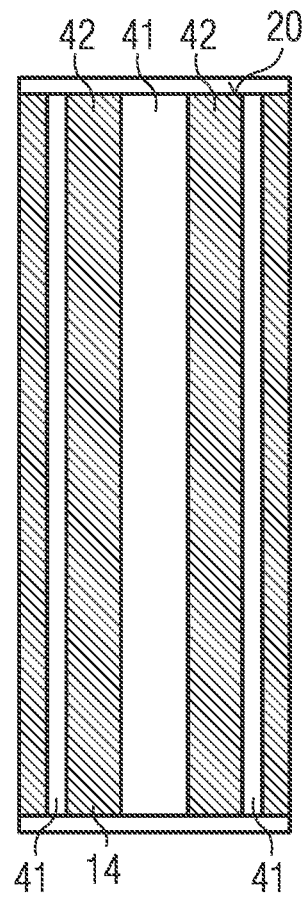
Figure 8D:
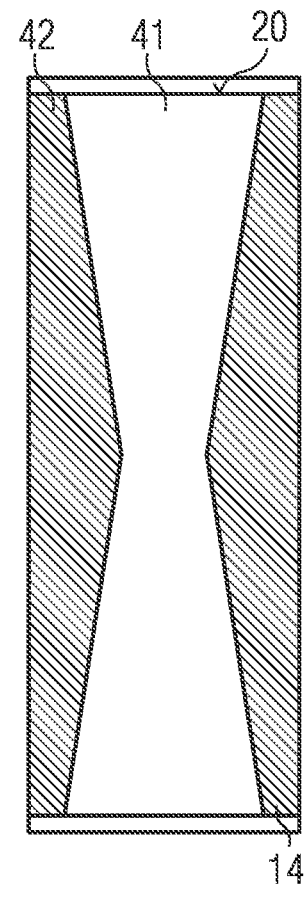
Figure 8E:
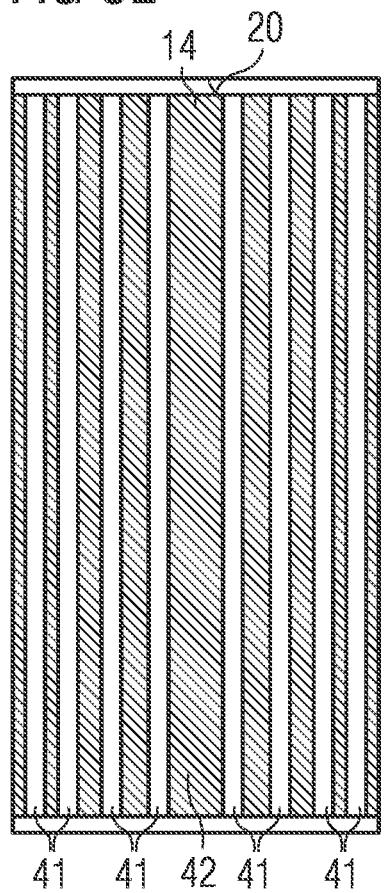
Figure 8F:
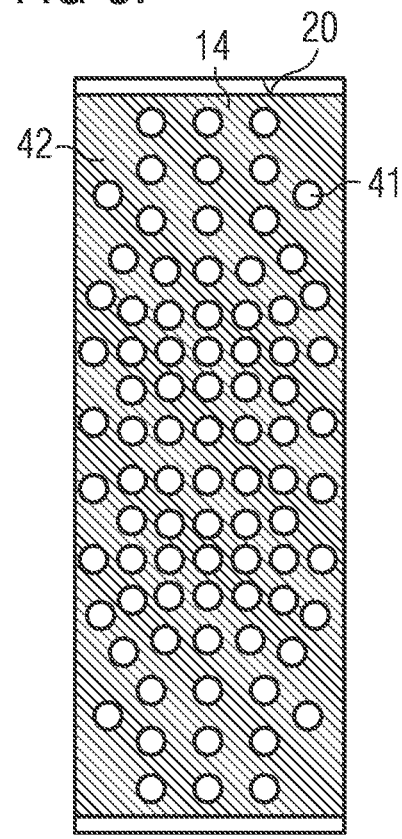
Figure 8G:
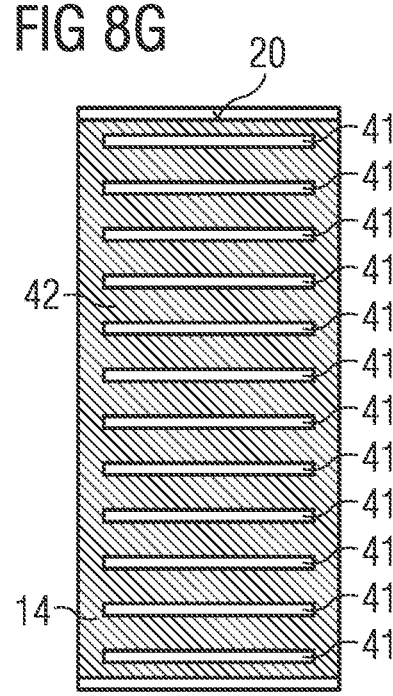
Figure 8H:
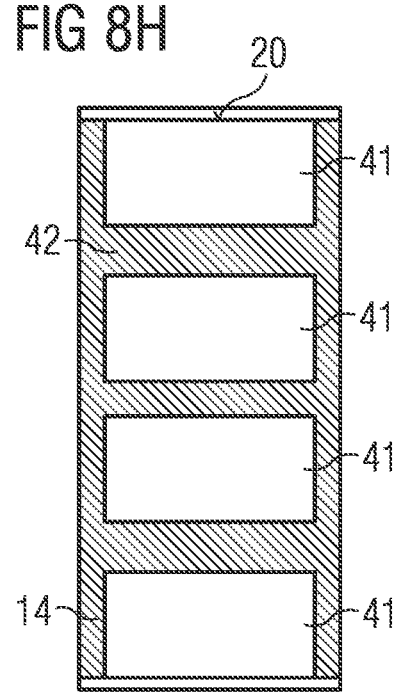
Figure 9A:
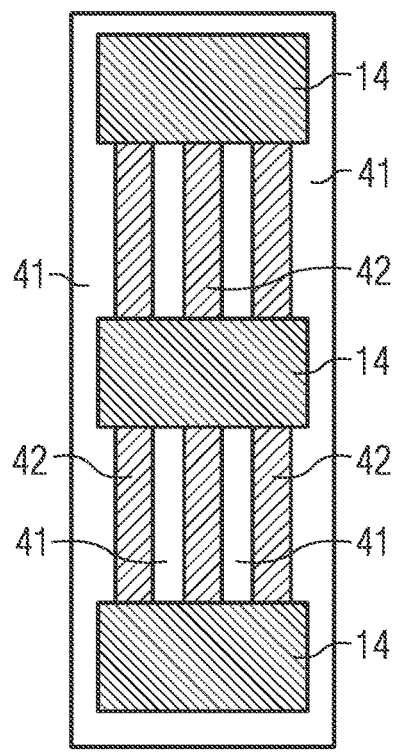
Figure 9B:
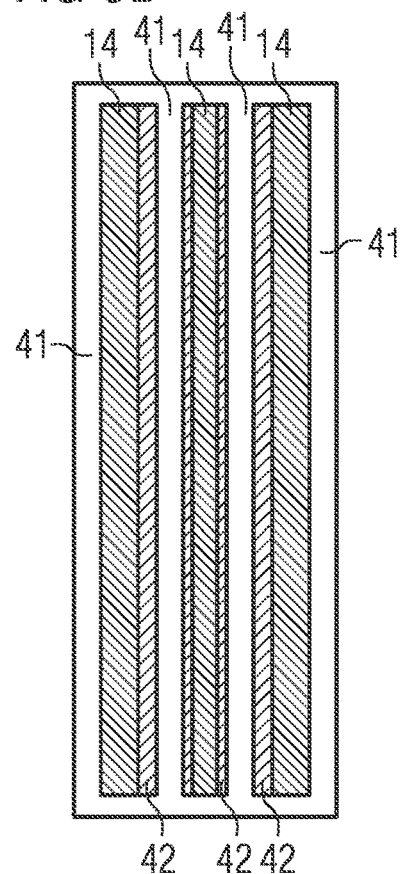
Figure 9C:
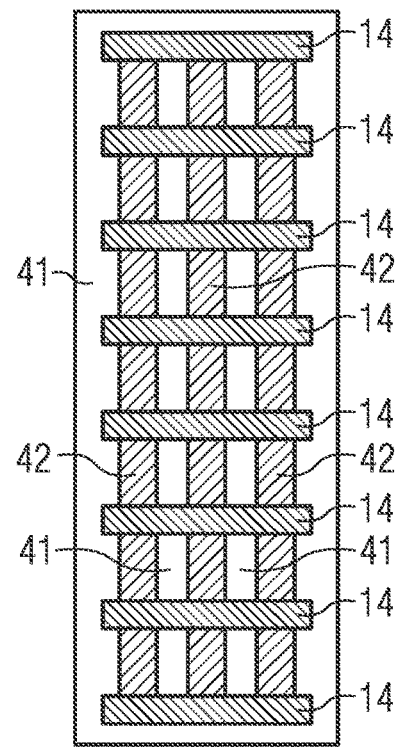
Figure 9D:
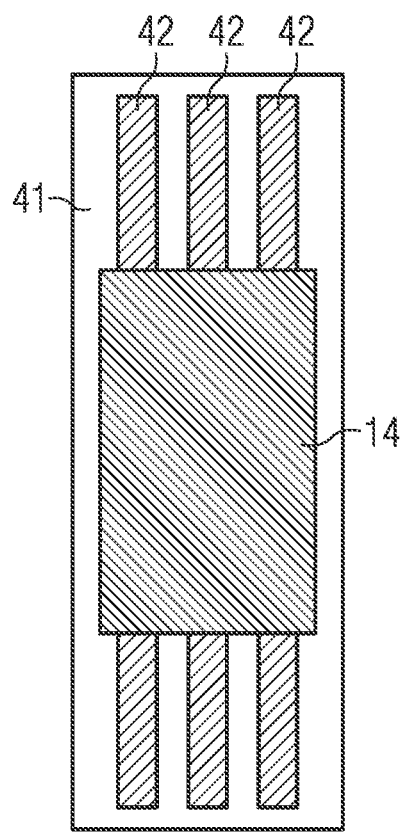
Figure 9E:
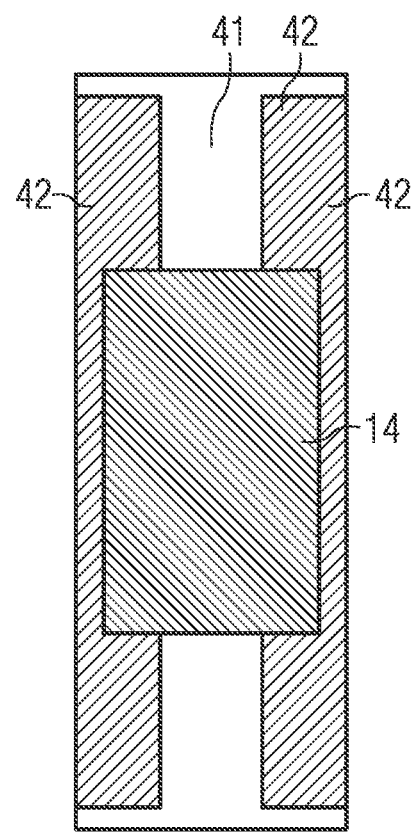

To improve the contact resistance between the material of the first cladding layer 4 and the bonding layer 15, a metallic contact layer 14 can alternatively or additionally be applied to the material of the first cladding layer 4, as shown in FIGS. 7B to 7D. The metallic contact layer 14 can preferably comprise or be made of one or more materials selected from Ti, Pt, Pd, Ni, Cr and Rh. For example, the metallic contact layer 14 can be applied to the material of the first cladding layer 4 and structured with it so that the contact layer 14 can be arranged only in the first regions 41, as shown in FIG. 7B. The first cladding layer 4 and in particular the first regions 41 can also be completely or partially covered and enclosed by the contact layer 14, as shown in FIG. 7C, which allows an even lower series resistance to be achieved. If the contact layer 14 is selectively applied only to some specific regions 41 of the first cladding layer 4 as shown in FIG. 7D, the current injection can be adjusted even finer.

FIGS. 8A to 8H show examples of arrangement variants of the contact layer 14 on second regions 42 of the first cladding layer 4, i.e., in voids of the second cladding layer 4 or on regions which differ from the first regions 41 in terms of material and/or thickness. The geometric arrangements correspond to the arrangements described in connection with FIGS. 3A to 3H. Alternatively, it can also be possible to arrange the contact layer 14 on the first regions 41 of the first cladding layer 4.

Furthermore, the contact layer 14 can also have a second structure different from the first structure of the first cladding layer 4 as shown in FIGS. 9A to 9E.

Even if in the examples shown the first cladding layer is only described with one transparent material or two different transparent materials, more than two different materials can be present in corresponding structured regions. The characteristics described in connection with the previous examples therefore also apply equally to a first cladding layer with more than two different materials.

The examples shown in the figures and, in particular, the respective described features are not limited to the respective combinations shown in the figures. Rather, the shown examples as well as single features thereof can be combined with one another, even if not all combinations are explicitly described. Moreover, the examples described in connection with the figures may alternatively or additionally comprise further features according to the description in the general part.

Our laser diodes are not limited by the description based on the examples. Rather, this disclosure includes each new feature and each combination of features, which includes in particular each combination of features in the appended claims, even if the feature or combination itself is not explicitly explained in the claims or examples.

This application claims priority of DE 10 2017 113 389.5, the subject matter of which is incorporated herein by reference.

What is claimed is:

1. A semiconductor laser diode comprising a semiconductor layer sequence having an active layer having a main extension plane and configured, in operation, to generate light in an active region and emit light via a light-outcoupling surface,
wherein
the active region extends from a back surface opposite the light-outcoupling surface to the light-outcoupling surface along a longitudinal direction in the main extension plane,
the semiconductor layer sequence has a surface region on which a first cladding layer is applied in direct contact,
the first cladding layer comprises a transparent material from a material system different from the semiconductor layer sequence,
the first cladding layer is structured and has a first structure,
the surface region has at least one first surface partial region and at least one second surface partial region immediately adjacent thereto,
the first cladding layer in the second surface partial region has a void formed by an opening or gap,
a metallic material is applied in the void, and
the metallic material in the void extends to the surface region of the semiconductor layer sequence and is in direct contact with the semiconductor layer sequence.

2. The semiconductor laser diode according to claim 1, wherein, in operation, the light generated in the active region extends into the first cladding layer.

3. The semiconductor laser diode according to claim 1, wherein the first cladding layer comprises a transparent conductive oxide.

4. The semiconductor laser diode according to claim 1, wherein the first cladding layer comprises at least two different transparent conductive oxides.

5. The semiconductor laser diode according to claim 4, wherein the at least two different transparent conductive oxides are deposited in an alternating layer stack on the surface region.

6. The semiconductor laser diode according to claim 1, wherein the semiconductor layer sequence is based on a III-V compound semiconductor material.

7. The semiconductor laser diode according to claim 1, wherein the first cladding layer has a first thickness in the first surface partial region and a second thickness in the second surface partial region, and the first thickness is greater than the second thickness.

8. The semiconductor laser diode according to claim 1, wherein the first cladding layer comprises a plurality of first regions between which there are second regions, and the second regions are formed as voids.

9. The semiconductor laser diode according to claim 1, wherein the first cladding layer comprises a plurality of regions formed as longitudinally or transversely extending stripes.

10. The semiconductor laser diode according to claim 1, wherein the first cladding layer comprises a plurality of island-shaped regions.

11. The semiconductor laser diode according to claim 1, wherein the semiconductor layer sequence comprises a ridge waveguide structure having a ridge top side and ridge side surfaces adjacent thereto, and the surface region is formed by the ridge top side.

\* \* \* \* \*